US010638582B2

(12) United States Patent
Yoo et al.

(10) Patent No.: US 10,638,582 B2
(45) Date of Patent: Apr. 28, 2020

(54) LIGHTING DEVICE

(71) Applicant: LUMENS CO., LTD., Yongin-si, Gyeonggi-do (KR)

(72) Inventors: Soogeun Yoo, Seoul (KR); Honggeol Choi, Suwon-si (KR); Hoyoung Lee, Seongnam-si (KR)

(73) Assignee: LUMENS CO., LTD., Yongin-si (KR)

( * ) Notice: Subject to any disclaimer, the term of this patent is extended or adjusted under 35 U.S.C. 154(b) by 0 days.

(21) Appl. No.: 15/996,739

(22) Filed: Jun. 4, 2018

(65) Prior Publication Data

US 2018/0279433 A1 Sep. 27, 2018

Related U.S. Application Data

(63) Continuation of application No. 15/882,522, filed on Jan. 29, 2018, now Pat. No. 10,015,852, which is a continuation of application No. 15/687,463, filed on Aug. 26, 2017, now Pat. No. 9,924,572, which is a continuation of application No. 15/194,430, filed on Jun. 27, 2016, now Pat. No. 9,781,791, which is a continuation of application No. 14/304,244, filed on Jun. 13, 2014, now Pat. No. 9,414,453.

(30) Foreign Application Priority Data

May 21, 2014 (KR) ........................ 10-2014-0061077

(51) Int. Cl.

| | |
|---|---|
| ***H05B 37/02*** | (2006.01) |
| ***H05B 45/46*** | (2020.01) |
| ***H05B 45/10*** | (2020.01) |
| ***H05B 45/37*** | (2020.01) |
| ***H05B 45/48*** | (2020.01) |
| ***H05B 47/10*** | (2020.01) |
| ***H05B 33/08*** | (2020.01) |

(52) U.S. Cl.

CPC ............. *H05B 45/46* (2020.01); *H05B 33/08* (2013.01); *H05B 45/10* (2020.01); *H05B 45/37* (2020.01); *H05B 45/48* (2020.01); *H05B 47/10* (2020.01); *H05K 999/99* (2013.01)

(58) Field of Classification Search

CPC .. H05B 41/28; H05B 41/295; H05B 41/2827; H05B 41/3925; H05B 41/34; H05B 41/32; H05B 41/30; H05B 33/0815; H05B 33/0818; H05B 41/2828; H05B 41/3921; H05B 41/3927; H05B 37/029; H05B 33/0803; H05B 37/0254; H05B 37/02; Y02B 20/202; H03K 3/55; G01N 21/67

See application file for complete search history.

(56) References Cited

U.S. PATENT DOCUMENTS 8,686,651 B2 * 4/2014 Lynch ................ H05B 33/0818 315/192
10,212,775 B2 * 2/2019 Huang ............... H05B 33/0815
(Continued)

*Primary Examiner* — Minh D A
(74) *Attorney, Agent, or Firm* — Mei & Mark LLP

(57) ABSTRACT

Disclosed is a light emitting device having a configuration that, when a magnitude of an input voltage is greater than a minimum light emitting voltage, all light emitting devices are turned on regardless of the magnitude of the voltage. As the magnitude of the voltage is smaller, the light emitting devices are connected in parallel. As the magnitude of the voltage is greater, the light emitting devices are serially connected.

16 Claims, 21 Drawing Sheets

(56) References Cited

U.S. PATENT DOCUMENTS

| | | | | |
|---|---|---|---|---|
| 2010/0060175 | A1* | 3/2010 | Lethellier | H05B 33/0815<br>315/164 |
| 2011/0109244 | A1* | 5/2011 | Grajcar | H05B 33/0827<br>315/294 |
| 2011/0127919 | A1* | 6/2011 | Lin | H05B 33/083<br>315/185 R |
| 2012/0153833 | A1* | 6/2012 | Mikani | H05B 33/0812<br>315/122 |
| 2013/0049599 | A1* | 2/2013 | Logiudice | H05B 33/083<br>315/122 |
| 2013/0147380 | A1* | 6/2013 | Chobot | H05B 33/0815<br>315/210 |
| 2013/0200802 | A1* | 8/2013 | Sakuragi | H05B 37/02<br>315/122 |

* cited by examiner (a)

(b)

| | CS1 | BS2 | CS2 | BS3 | CS3 | BS4 | CS4 | BS5 | CS5 |
|---|---|---|---|---|---|---|---|---|---|
| P0 | ON | ON | ON | ON | ON | ON | ON | ON | ON |
| P1 | ON | ON | ON | ON | ON | ON | ON | ON | ON |
| P2 | OFF | OFF | ON | ON | ON | ON | ON | ON | ON |
| P3 | OFF | OFF | OFF | OFF | ON | ON | ON | ON | ON |
| P4 | OFF | OFF | OFF | OFF | OFF | OFF | ON | ON | ON |
| P5 | OFF | OFF | OFF | OFF | OFF | OFF | OFF | OFF | ON |

LIGHTING DEVICE

CROSS-REFERENCE TO RELATED PATENT APPLICATION

This application is a continuation of U.S. application Ser. No. 15/882,522, filed Jan. 29, 2018, which is a continuation of U.S. application Ser. No. 15/687,463, filed Aug. 26, 2017, now U.S. Pat. No. 9,924,572, which is a continuation of U.S. application Ser. No. 15/194,430, filed Jun. 27, 2016, now U.S. Pat. No. 9,781,791, which is a continuation of U.S. application Ser. No. 14/304,244, filed Jun. 13, 2014, now U.S. Pat. No. 9,414,453, which claims the benefit of priority to Korean Patent Application No. 10-2014-0061077 filed with the Korean Intellectual Property Office on May 21, 2014, the disclosures of which are incorporated herein by reference in their entirety.

BACKGROUND

1. Field of the Invention

The present invention relates to a lighting device, and particularly, to a lighting device that a serial/parallel connection structure of a light emitting device is changeable according to an input voltage.

2. Description of the Related Art

A light emitting diode (LED) refers to a kind of semiconductor device capable of realizing a light of various colors by configuring a light emitting source through forming a PN diode from a compound semiconductor. Such a light emitting device is advantageous in that it has a long life, miniaturization and weight-lightening are enabled, and low voltage driving is possible. In addition, such a light emitting device is robust to a shock and vibration, and warm-up time and complex driving are not necessary. The light emitting device may be applied to a backlight unit or various lighting devices by being mounted on a substrate or a lead frame in various types, packaged, and then modularized according to various uses A plurality of LEDs are used to provide one independent lighting device, and at this point, the LEDs may be used with being connected serially or in parallel. At this point, in order for all the LEDs to be an 'ON' state all the time, commercial power is converted into DC power and then applied to the LEDs.

In this way, when DC power is supplied and used, an additional DC rectifying unit is necessary. However, a configuration of this DC rectifying unit may be removed and AC power may be directly applied to the LEDs. At this point, the LEDs may be connected serially and an ON/OFF state of each of the LEDs may be changed according to a magnitude of a varying input voltage. As the ON/OFF state is repeated, a flicker phenomenon occurs, a utilization rate of each of the LEDs becomes lowered, and accordingly light output efficiency is reduced.

SUMMARY OF THE INVENTION

The present invention provides an LED driving device capable of increasing an LED utilization rate and increasing light output efficiency by solving the above-described issues in an LED deriving scheme of directly applying AC power.

An LED driving device according to an aspect of the present invention, AC power is converted into DC power through a bridge diode, and then the numbers of parallel and serial connections in an LED group are automatically adjusted according to a voltage level of a DC-converted ripple voltage and a total current applied to the LED group is increased according to voltage steps. Accordingly, a power factor and efficiency can be improved at the same time.

According to an aspect of the present invention, a lighting device includes: a light emitting unit comprising a current input terminal, a current output terminal, a current bypass output terminal, and a first light emitting group emitting a light by a current input to the current input terminal; and a second light emitting group connected to receive at least a part of a current output through the current output terminal, wherein the current output terminal selectively outputs the entirety of or a part of a current input through the current input terminal, and when the current output terminal outputs the part of the current, the current bypass output terminal outputs a rest of the entirety of the current other than the part of the current.

The rest of the current may be at least a part of or the entirety of a current flowing through the first light emitting group.

The second light emitting group may belong to another light emitting unit including another current input terminal, another current output terminal, another current bypass output terminal, and the second light emitting group emitting a light by a current input to the other current input terminal, and the current bypass output terminal included in the light emitting unit may be connected to the other current bypass output terminal included in the other light emitting unit.

The second light emitting group may be included in another light emitting group having the same configuration as the light emitting unit.

When a voltage applied to the current input terminal has a first potential, the current output terminal may output the part of the current, and, when the voltage input to the current input terminal has a second potential greater than the first potential, the current output terminal may output the entirety of the current.

Here, a reverse current blocking unit may be connected between the current output terminal and the light emitting unit and prevent a current from flowing from the current output terminal to the light emitting unit.

According to another aspect of the present invention, a light emitting device, includes: a power supply unit supplying power having a variable potential; a plurality of light emitting groups electrically connected to each other to have sequential numbers from upstream towards downstream and receiving the power from the power supply unit; a first bypass unit; and a second bypass unit, wherein each of the plurality of light emitting groups comprises at least one light emitting device, the first bypass unit intermittently and electrically connecting an upstream stage of a first light emitting group, which is at an arbitrary location, and an upstream stage of a second light emitting group, which is at an arbitrary location behind the first lighting group towards downstream; and the second bypass unit intermittently and electrically connecting a downstream stage of the first light emitting group and a downstream stage of the second light emitting group or a downstream stage of a third light emitting group, which is at an arbitrary location behind the second lighting group towards downstream.

When the first bypass unit connects the upstream stage of the first light emitting group and the upstream stage of the second light emitting group, the first bypass unit may operate as a static current source.

When the current flows through the first bypass unit, the current may flow through the second bypass unit, and, when the current does not flow through the first bypass unit, the current may not flow through the second bypass unit.

According to another aspect of the present invention, an LED lighting device includes: N light emitting channels (where N is a natural number of 2 or greater) linearly connected and each of which includes one or more LEDs; a rectifying unit rectifying AC power and provide the rectified AC power to the N light emitting channels; a plurality of electric power distribution circuit units each including an electric power distribution switch bifurcated at each connection unit between the light emitting channels, connected to the ground, and intermittently connecting a current flowing through a connection path between each of the connection units and the ground; and a jump circuit unit including a jump switch bifurcated from an input stage of Mth light emitting channel (where, M is a natural number not smaller than 1 and not greater than (N−1)) among the light emitting channels, connected to an input stage of the (M+1)th light emitting channel, and intermittently connecting a current flowing through a connection path between the input stage of the Mth light emitting channel and the (M+1)th light emitting channel.

At this point, Mth electric power distribution unit connected to one node of a connection path between the input stage of the Mth light emitting channel and an input stage of the (M+1)th light emitting channel among the plurality of electric power distribution units, when a current flows through the jump circuit unit, the current may flow through an Mth electric power distribution circuit unit, and, when a current does not flow through the jump circuit unit, the current may not flow through the Mth electric power distribution unit.

At this point, a reverse current blocking unit may be further included which is disposed on a line between a connection unit between the Mth light emitting channel and the (M+1)th light emitting channel, and an input unit of the (M+1)th light emitting channel, and blocks a current flowing towards the input stage of the (M+1)th light emitting channel from flowing towards the rectifying unit.

According to another aspect of the present invention, an LED driving device includes a plurality of LED light emitting groups sequentially connected, each of which includes one or more LED devices. This LED driving device includes a power supply applying AC power to an LED light emitting group at one end side of the LED light emitting groups; a bypass line connecting an input stage and an output stage of a first LED group among the LED light emitting groups; and a bypass switch disposed on a bypass line and closing the bypass line when a potential of power supplied by the power supply is not greater than a potential able to turn on next LED light emitting groups following the first LED light emitting group.

According to another aspect of the present invention, an AC powered LED lighting device includes: a plurality of light emitting groups linearly and electrically connected to have sequential numbers from uppermost stream toward downmost stream; a first circuit unit connecting connection points between the plurality of light emitting groups to the ground; and a second circuit unit bypass-connecting the connection points, wherein a light emitting group in the uppermost stream to a light emitting group in the downmost stream are sequentially converted from parallel connections into serial connections while a potential of the supplied AC power increases, and each of the plurality of light emitting groups comprises one or more LED devices.

According to another aspect of the present invention, a lighting device includes: a light emitting unit comprising a first light emitting group, a first bypass unit, a second bypass unit, and a current input terminal commonly connected to an input stage of the first light emitting group and an input stage of the first bypass unit and through which a current is supplied to the first light emitting group and the first bypass unit; and a second light emitting group connected to the light emitting unit to receive a current output from an output stage from the first light emitting group in a first circuit state and receive a current output from an output stage of the first bypass unit in a second circuit state, wherein the first bypass unit is cut off to allow the current not to flow through the first bypass unit in the first circuit state, and the second bypass unit is cut off to allow the current output from the first light emitting group not to flow through the second bypass unit, and the current flows through the first bypass unit in the second first circuit state and a part of the current output from the first light emitting group flows through the second bypass unit.

At this point, an output terminal of the second bypass unit may be connected to the current output terminal of the second light emitting group.

The second light emitting group may be included in another light emitting unit having the same configuration as that of the light emitting unit.

The input voltage at the current input terminal may be greater in a first time period than that in a second time period.

DETAILED DESCRIPTION OF THE INVENTION

Reference will now be made in detail to the embodiments of the present disclosure, examples of which are illustrated in the accompanying drawings. The present invention may, however, be embodied in different forms and should not be constructed as limited to the embodiments set forth herein. The terminology used herein is for the purpose of assisting in understanding embodiments and is not intended to be limiting of the invention. In addition, it is to be understood that the singular forms "a," "an," and "the" include plural referents unless the context clearly dictates otherwise.

Figure 1:
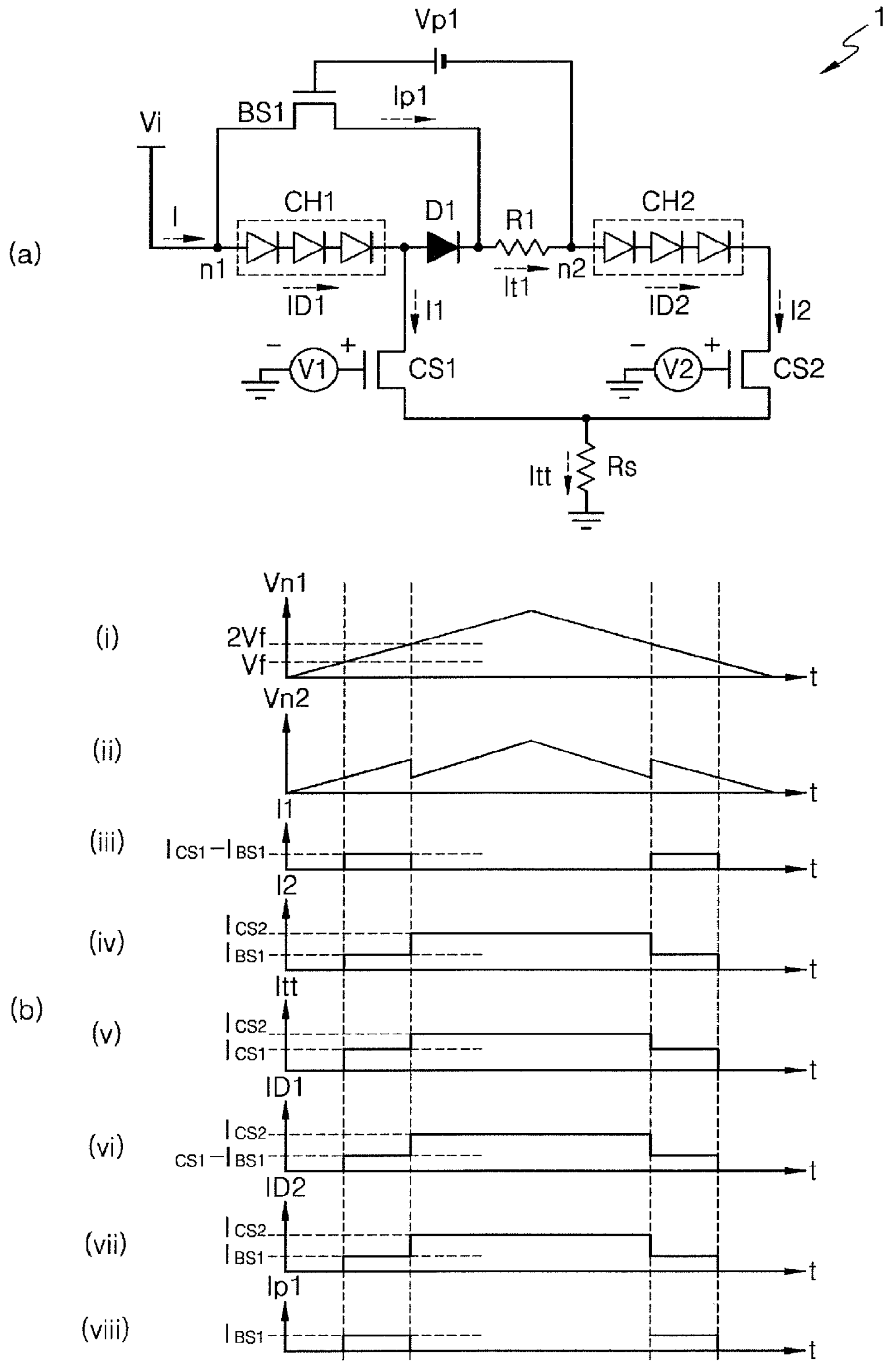
FIG. 1 illustrates an exemplary LED lighting circuit and an operation principle thereof according to an embodiment of the present invention.

FIG. 1 illustrates an exemplary LED lighting circuit and an operation principle thereof according to an embodiment of the present invention.

An LED lighting circuit 1 in (a) of FIG. 1 includes a plurality of light emitting groups CH1 and CH2 connected to each other. The light emitting groups CH1 and CH2 is mutually changeable between a serial connection state and a parallel connection state. Reconfiguration of this connection state may be formed by adjusting ON/OFF states of an electric power distribution switch CS1 and a bypass switch BS1. The ON/OFF states of the electric power distribution switch CS1 and the bypass switch BS1 may be automatically adjusted according to a magnitude of an input voltage Vi.

In (a) of FIG. 1, the bypass switch BS1 and the electric power distribution switch CS1 may be formed of transistors. An example of the transistor may include, but is not limited to, a bipolar transistor (BT), a field effect transistor (FET), or an insulated gate bipolar transistor (IGBT).

When the bypass switch BS1 operates in a non-saturation region, a magnitude of a current Ip1 flowing through the bypass switch BS1 may be determined by a ratio of a bias voltage Vp1 over a value of a resistor R1. That is, the bypass switch BS1, the current Ip1, and the bias voltage Vp1 may provide one current source. On the contrary, when the bypass switch BS operates in a saturation region, the bypass switch BS1 may represent similar property to a resistor.

Furthermore, when the electric power switch CS1 operates in a non-saturation region, a magnitude of a current I1 flowing through the electric power distribution switch CS1 may be determined by a ratio of a bias voltage V1 over a value of a resistor Rs. That is, the electric power distribution switch CS1, the current II and the bias voltage V1 may provide one current source. On the contrary, when the electric power distribution switch CS1 operates in a saturation region, the electric power distribution switch CS1 may represent similar property to a resistor.

(b) of FIG. 1 represents voltage and current characteristics according to a time in each node and each device of the LED lighting circuit 1 in FIG. 1A.

Hereinafter, for convenience of explanation, it is assumed that forward voltages of the light emitting groups CH1 and CH2 are all Vf. In addition, it is also assumed that maximum current values designed to flow through the bypass switch BS1, the electric power distribution switch CS1 and an electric power distribution switch CS2 are respectively, $I_{RS1}$, $I_{CS1}$, and $I_{CS2}$.

When an input voltage Vn1 is in between 0 to Vf, the current does not flow through the circuit.

When the input voltage Vn1 is in between Vf to 2Vf, the bypass switch BS1 and the electric power distribution switch CS1 operate as current sources in their non-saturation regions, and the electric power distribution switch CS2 may operate in the saturation region. At this point, a current having a magnitude of $I_{RS1}$ may flow through the bypass switch BS1 and the electric power distribution switch CS2. In addition, at this point, a magnitude of a current flowing through the electric power distribution switch CS2 may be a value that a value of a current $I_{RS1}$ flowing through the electric power distribution switch CS2 is subtracted from $I_{CS1}$. In addition, a current IDI flowing through the light emitting group CH1 is identical to a value $I_{CS1}$-$I_{RS1}$ of a current flowing through the electric power distribution switch CS1 and to a value $I_{BS1}$ of a current flowing through the electric power distribution switch CS2. At this point, since the input voltage is not sufficiently high, a current does not flow through a diode D1.

When the input voltage Vn1 is not smaller than 2Vf, a current becomes to flow through the diode D1. At this point, the bypass switch BS1 is switched into an OFF state while an additional current is flowed into a resistor R1 through the diode D1. In addition, the electric power distribution switch CS2 may become to operate in a non-saturation region, and the electric power distribution switch CS1 may be switched into an OFF state. At this point, a current of a magnitude of $I_{CS2}$ may flow through the electric power distribution switch CS2. In addition, the current ID1 flowing through the light emitting groups CH1 and CH2 has an identical value to a value of a current $I_{cs2}$ flowing through the electric power distribution switch CS2.

Figure 2:
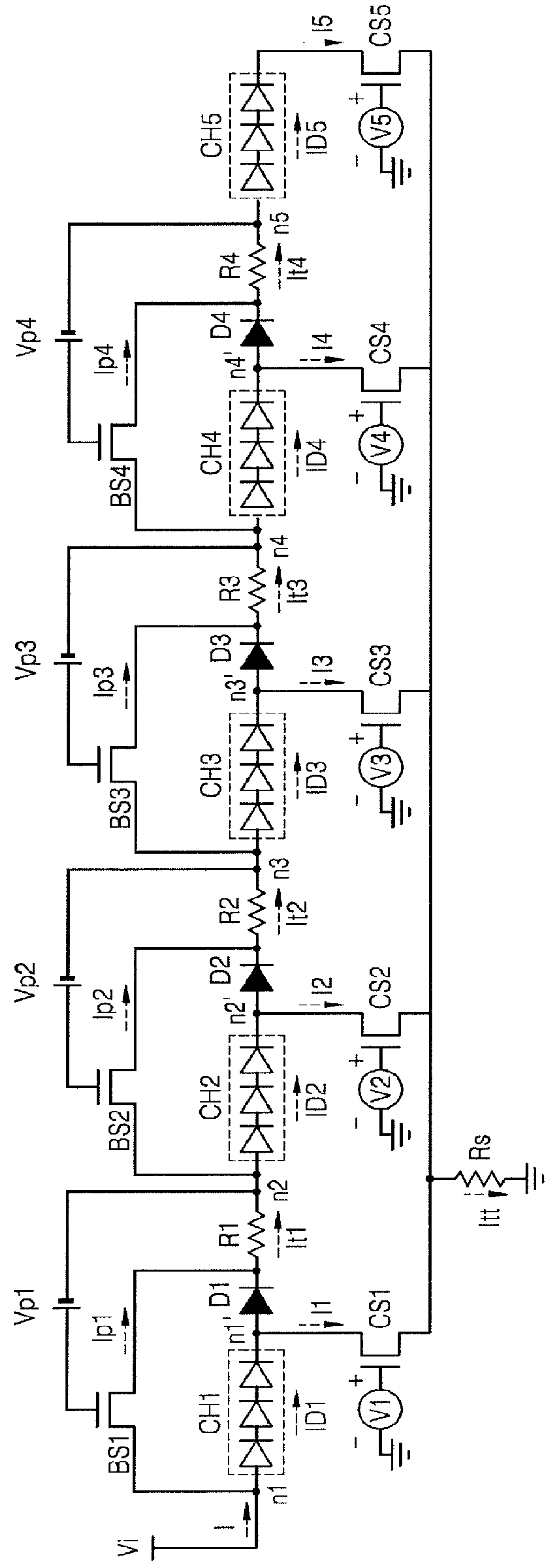
FIG. 2 illustrates an exemplary LED lighting circuit according to another embodiment of the present invention.

FIG. 2 illustrates an exemplary LED lighting circuit according to another embodiment of the present invention.

The LED lighting device 1 illustrated in FIG. 2 is that the LED lighting circuit of FIG. 1A is extended and modified.

The LED lighting circuit 1 according to FIG. 2 has a plurality of light emitting groups CH1 to CH5 connected to each other. Each state of the light emitting groups CH1 to CH5 may be changed between a serial connection state and a parallel connection state, and this reconfiguration of the connection state may be achieved by adjusting ON/OFF states of electric power distribution switches CS1 to CS4 and bypass switches CS1 to CS4. The ON/OFF states of the electric power distribution switches CS1 to CS4 and the bypass switches CS1 to CS4 may be automatically adjusted according to a magnitude of an input voltage Vi.

Figure 3:
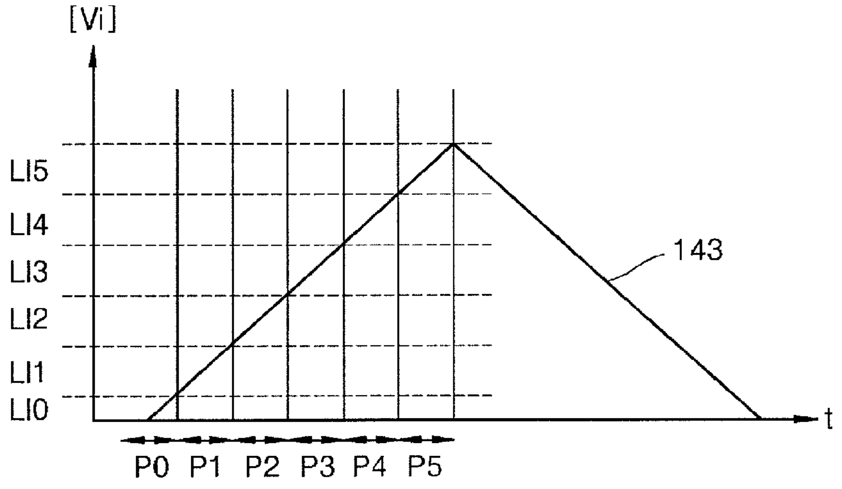
FIG. 3 illustrates an ON/OFF state of each switch according to an input voltage, which is included in the LED lighting circuit in FIG. 1.

FIG. 3 illustrates ON/OFF states according to an input voltage of each switch included in the LED lighting circuit.

A graph 143 in (a) of FIG. 3 represents a magnitude of the input voltage Vi according to a time. The input voltage may be given in a triangular wave type as shown in (a) of FIG. 3 or in various types such as a square wave or a saw tooth wave.

A magnitude of the input voltage Vi may be divided into a plurality of voltage periods LI0 to LI5, and each of the voltage periods LI0 to LI5 may match with a plurality of time periods P0 to P5. Lengths and locations of the plurality of time periods P0 to P5 on the time axis t may be determined by specific values of forward voltages of the light emitting groups CH1 to CH5 as shown in FIG. 2.

In each of the time periods P0 to P5 illustrated in (a) of FIG. 3, the LED circuit may operate in a steady state. However, the LED circuit may operate in a transient state that a state of the LED circuit is switched between time periods P0 to P5. The steady state is mainly described herein for convenience of explanation.

Each row in (b) of FIG. 3 represents time periods P0 to P5, and each column represents an ON/OFF state according to time periods P0 to P5 of each switch BS1 to BS4, and CS1 to CS5 in FIG. 2. This ON/OFF state change may be automatically performed by the LED lighting device 1 illustrated in FIG. 1.

Hereinafter, an operation principle of the LED lighting circuit 1 according to FIG. 1 is described with reference to FIGS. 3A to 5E.

Figure 4A:
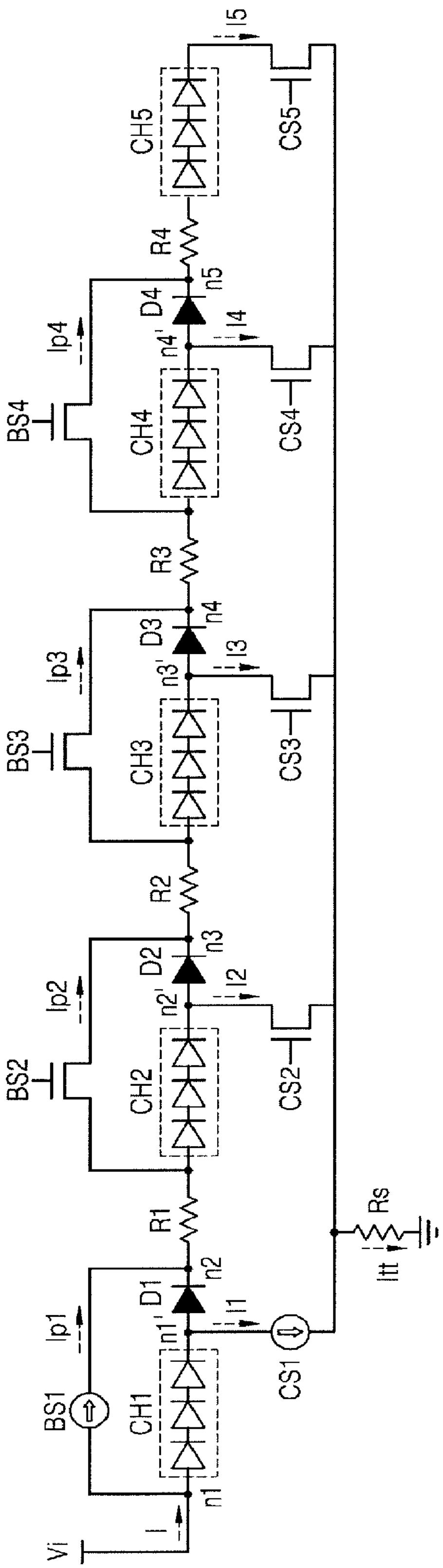
FIGS. 4A to 4E illustrate circuit structures of an LED lighting circuit in time periods P1 to P5, respectively.

FIGS. 4A to 4E illustrate circuit structures of the LED lighting circuit 1 in each time period P1 to P5. In addition, FIG. 4A illustrates a configuration of the LED lighting device 1 in the time period P0 as well as the time period P1.

In the time period P0, since the magnitude of the input voltage Vi is not sufficiently great, any one of the light emitting groups CH1 to CH5 may not be turned on.

In a time period P1, since the bypass switches BS1 to BS4 and the electric power distribution switch CS1 to CS5 are all turned on, the circuit illustrated in FIG. 2 has an identical structure to one in FIG. 4A. At this point, among the turned-on switches, the bypass switch BS1 and the electric power distribution switch CS1 operate in their non-saturation regions and play a role of a current source. In addition, rest of the turned-on switches may operate in their saturation regions. At this point, since anode voltages of reverse current blocking diodes D1, D2, D3, and D4 are higher than cathode voltages thereof, both terminals of these diodes are considered as open. Accordingly, the circuit illustrated in FIG. 4A may be represented as an equivalent circuit of FIG. 5A.

Figure 4B:
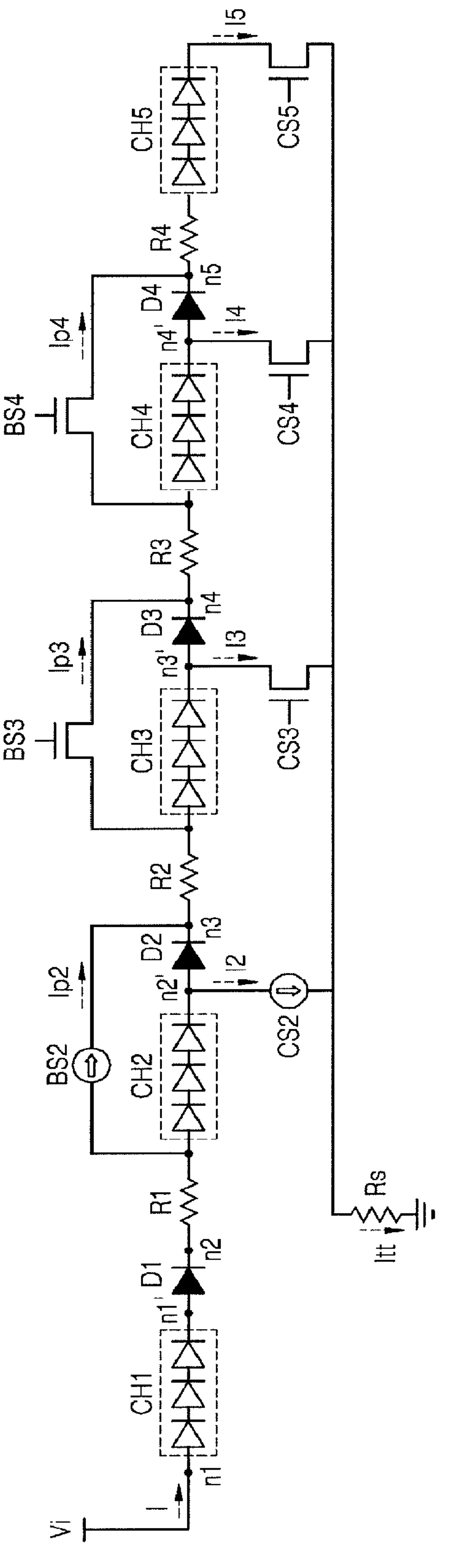
Figure 4C:
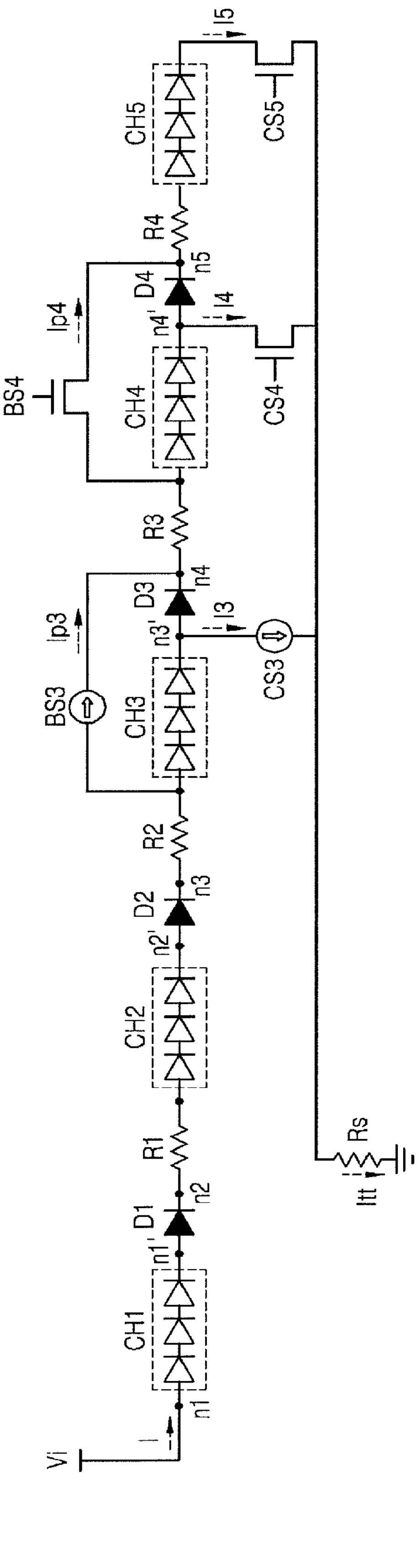

In the time period P2, since the bypass switches BS2 to BS4 and the electric power distribution switched CS2 to CS5 are all turned on and the bypass switch BS1 and the electric power distribution switch CS1 are all turned off, the circuit illustrated in FIG. 2 has a structure of the circuit in FIG. 4B. At this point, the bypass switch BS1 and the electric power distribution switch CS1 among the turned-on switches may operate in the non-saturation regions and play a role of a current source. Furthermore, the rest of the turned-on switches may operate in the saturation regions. At this point, since anode voltages of the reverse current blocking diodes D2, D3, and D4 are higher than cathode voltages thereof, both terminals of the diodes are considered as open. Accordingly, the circuit illustrated in FIG. 4B may be represented as an equivalent circuit of FIG. 5.

In a time period P3, since the bypass switches BS3 and BS4 and the electric power distribution switches CS3 to CS5 are all turned on and the bypass switches BS1 and BS2 and the electric power distribution switches CS1 and CS2 are all turned off, the circuit illustrated in FIG. 2 has the same structure as that of the circuit in FIG. 4. At this point, the bypass switch BS3 and the electric power distribution switch CS3 among the turned-on switches operate in the non-saturation region and play a role of a current source. At this point, since rest of the turned-on switches may operate in their saturation region. At this point, since anode voltages of the blocking diodes D3 and D4 are higher than cathode voltages thereof, both terminals of the diodes are considered as open. Accordingly, the circuit illustrated in FIG. 4C may be represented as an equivalent circuit of FIG. 5C.

Figure 4D:
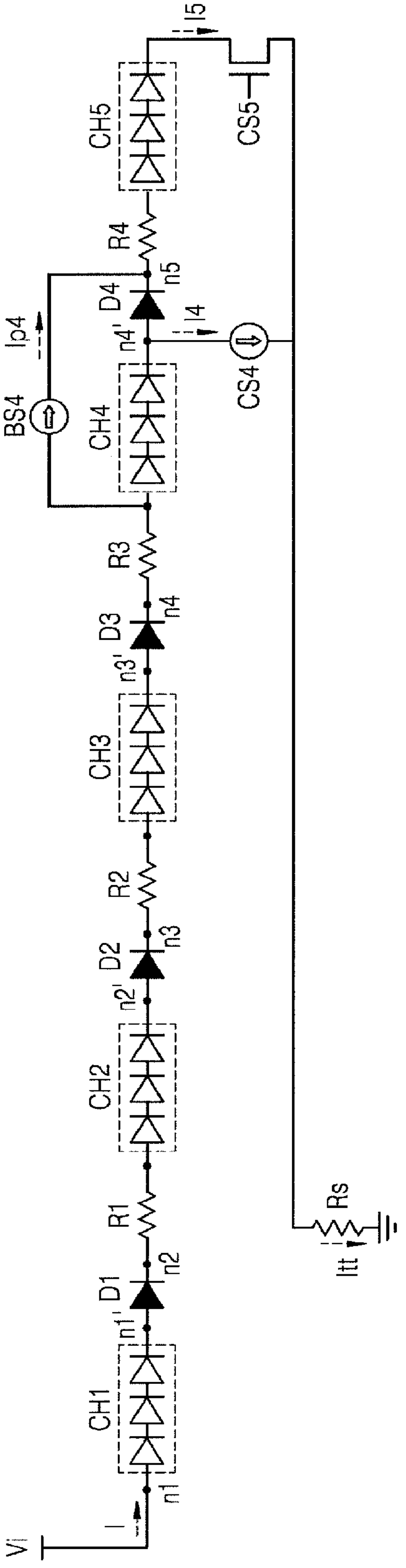

In the time period P4, since the bypass switch BS4 and the electric power distribution switches CS4 and CS5 are all turned on and the bypass switches BS1 to BS3 and the electric power distribution switches CS1 to CS3 are all turned off, the circuit illustrated in FIG. 2 has the same structure as that in FIG. 4D. At this point, the bypass switch BS4 and the electric power distribution switch CS4 operate in their non-saturation regions and play a role of a current source. In addition, since an anode voltage of the blocking diode D4 is higher than a cathode voltage, both terminals of the diode may be considered open. Accordingly the circuit illustrated in FIG. 4D may be represented as an equivalent circuit in FIG. 5D.

Figure 4E:
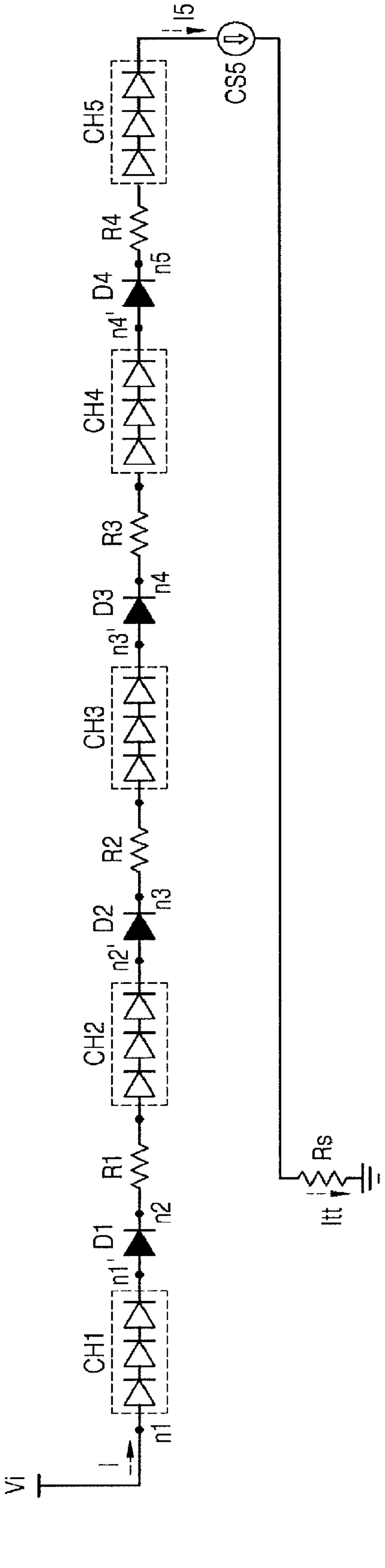

In the time period P5, since the electric power distribution switch CS5 is turned on, and the bypass switches BS1 to BS4 and the electric power distribution switches CS1 to CS4 are all turned off, the circuit illustrated in FIG. 2 has the same structure as that in FIG. 4E. At this point, the electric power distribution switch CS5 may operate in the non-saturation region and play a role of a current source. The circuit illustrated in FIG. 4E may be represented as an equivalent circuit in FIG. 5E.

As described above, it may be understood that FIGS. 5A to 5E may respectively represent approximated equivalent circuits of the circuits in FIGS. 4A to 4E.

From the equivalent circuits illustrated in FIGS. 5A to 5E, it may understood that a circuit structure of the LED lighting circuit 1 illustrated in FIG. 2 is changed according to a magnitude of the input voltage Vi.

Figure 5A:
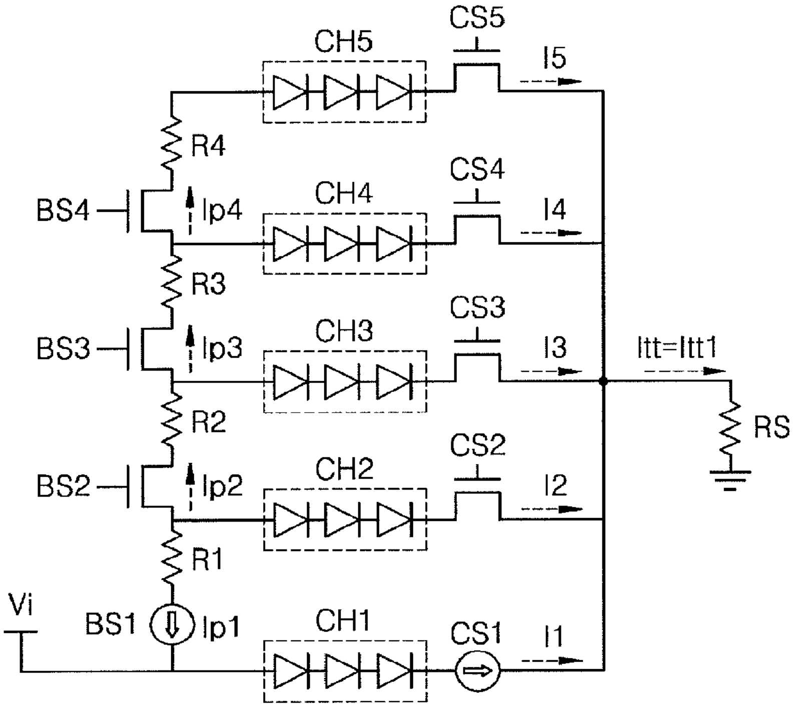
FIGS. 5A to 5E illustrates approximated equivalent circuits of the circuits according to FIGS. 4A to 4E, respectively.

In FIG. 5A illustrating a configuration in the time period P1, the lighting groups CH1 to CH5 are connected in parallel.

Figure 5B:
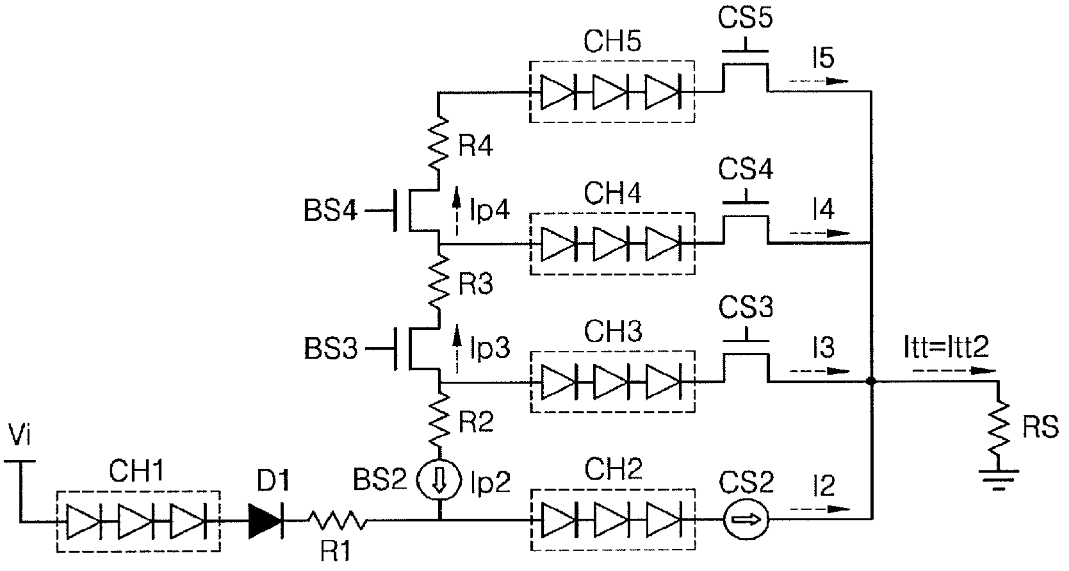

In FIG. 5B illustrating the time period P2, the light emitting groups CH2 to CH5 are connected in parallel, and the lighting emitting group CH1 is serially connected to them.

Figure 5C:
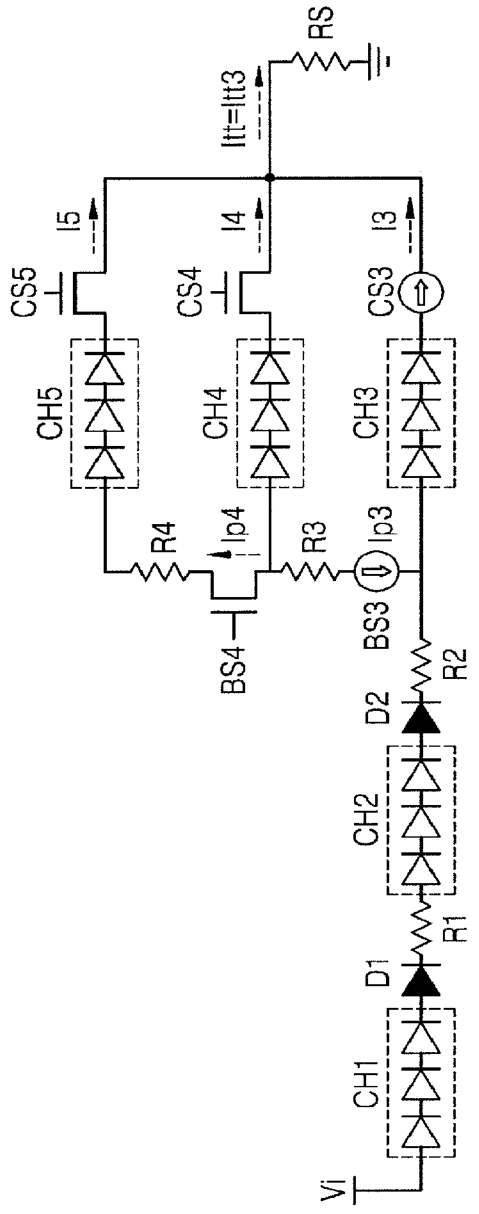

In FIG. 5C illustrating the time period P3, the light emitting groups CH3 to CH5 are connected in parallel, and the lighting emitting groups CH1 and CH2 are serially connected to them.

Figure 5D:
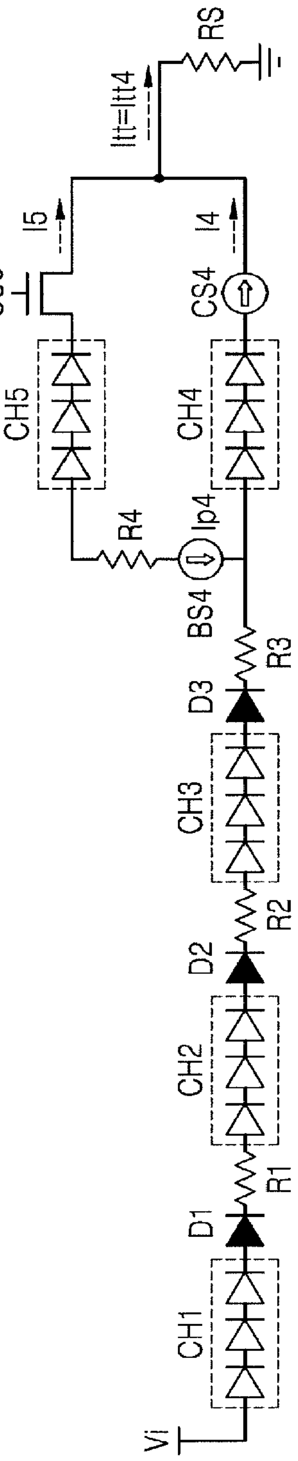

In FIG. 5D illustrating the time period P4, the light emitting groups CH4 and CH5 are connected in parallel, and the lighting emitting groups CH1 to CH3 are serially connected to them.

Figure 5E:
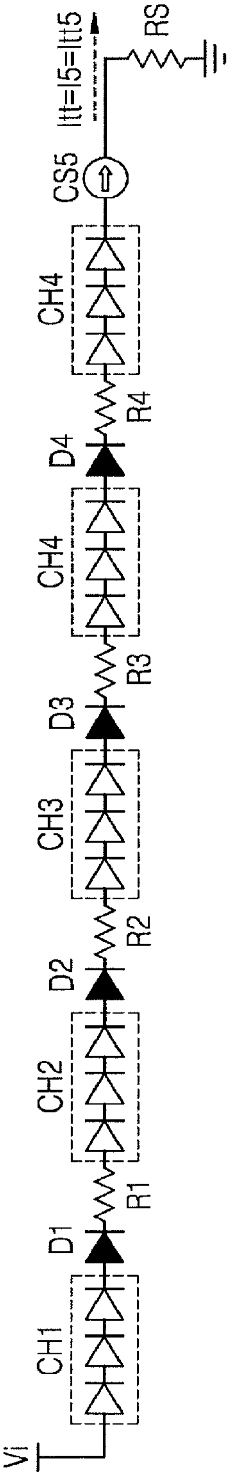

In FIG. 5E illustrating the time period P5, the light emitting groups CH1 to CH5 are serially connected to each other.

In the circuits in FIGS. 5A to 5E, a total sum of currents input and output from and to each LED lighting circuit in the time periods P1 to P5 may be respectively defined as Itt1, Itt2, Itt3, Itt4, and Itt5. At this point, it may be designed to satisfy a relationship that Itt5>Itt4>Itt3>Itt2>Itt1. In a case where the circuit is designed in this way, as the magnitude of the input voltage Vi increases, the total sum of the supplied current tends to be increased, and accordingly a power factor may be improved.

Hereinafter, an embodiment is described with reference to FIGS. 5A to 5E, where the circuit is designed to satisfy the above-described relationship that Itt5>Itt4>Itt3>Itt2>Itt1.

Referring to FIG. 5A, the electric power distribution switch CS1 operates in a non-saturation region and a value of I1 is adjusted so that a value of I1+I2+I3+I4+I5 becomes the same value as $I_{CS1}$ which is a maximum value that is passable by the electric power distribution switch CS1. At this point, a ratio between I1 and I2+I3+I4+I5 may be determined by a maximum current value $I_{RS1}$ provided when the bypass switch BS1 operates as a current source. Accordingly, Itt1=$I_{CS1}$ is established.

Referring to FIG. 5B, the electric power distribution switch CS2 operates in a non-saturation region and a value of I2 is adjusted so that a value of I2+I3+I4+I5 becomes the same value as $I_{CS2}$ which is a maximum value that is passable by the electric power distribution switch CS2. At this point, a ratio between I2 and I3+I4+I5 may be determined by a maximum current value $I_{RS2}$ provided when the bypass switch BS2 operates as a current source. Accordingly, Itt2=$I_{CS2}$ is established.

Referring to FIG. 5C, the electric power distribution switch CS3 operates in a non-saturation region and a value of I3 is adjusted so that a value of I3+I4+I5 becomes the same value as $I_{CS3}$ which is a maximum value that is passable by the electric power distribution switch CS3. At this point, a ratio between I3 and I4+I5 may be determined by a maximum current value $I_{RS3}$ provided when the bypass switch BS3 operates as a current source. Accordingly, Itt3=$I_{CS3}$ is established.

Referring to FIG. 5D, the electric power distribution switch CS4 operates in a non-saturation region and a value of I4 is adjusted so that a value of I4+I5 becomes the same value as $I_{CS4}$ which is a maximum value that is passable by the electric power distribution switch CS4. At this point, a ratio between I4 and I5 may be determined by a maximum current value $I_{RS2}$ provided when the bypass switch BS4 operates as a current source. Accordingly, Itt4=$I_{CS4}$ is established.

Referring to FIG. 5E, the electric power distribution switch CS5 operates in a non-saturation region. Accordingly, Itt5=$I_{CS5}$ is established.

In a specific instance, in order to allow relative brightness among the light emitting groups CH1 to CH5 to be as uniform as possible, a maximum current value, which may be provided when the switches CS1 to CS5 and BS1 to BS4 operate as current sources, may be optimized.

Figure 6A:
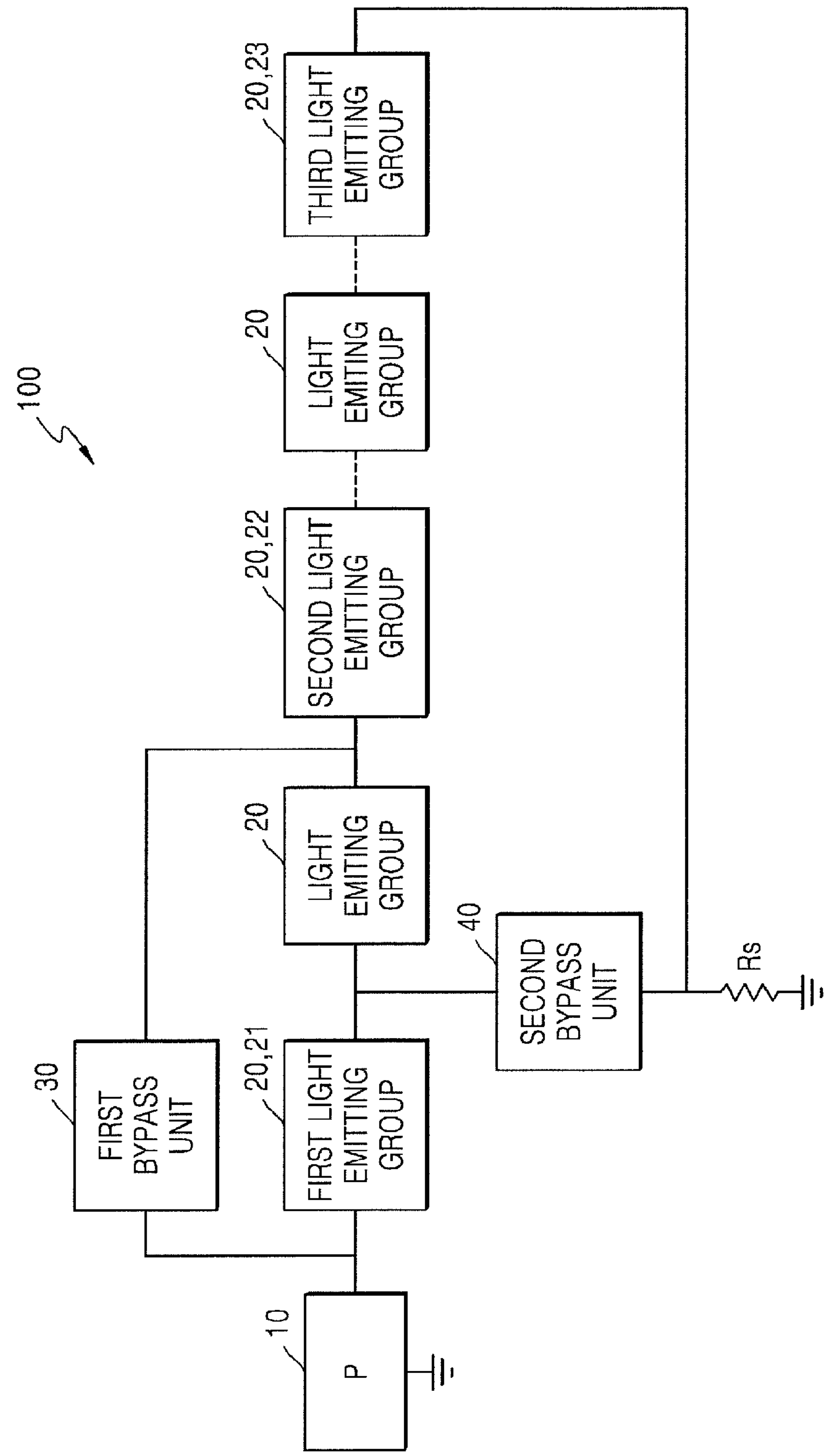
FIG. 6A is a view for explaining a structure of a light emitting device according to an embodiment of the present invention.

FIG. 6A is a view for explaining a structure of a light emitting device according to an embodiment of the present invention.

In FIG. 6A, a light emitting device 100 may be the above-described lighting circuit 1.

The light emitting device 100 may include a power supply unit 10 supplying power having a variable potential and a plurality of light emitting groups 20.

Here, each light emitting group 20 includes at least one light emitting device 901 and is electrically connected to each other so as to have sequential numbers from upstream towards downstream, and receives power from the power supply unit 10. Here, 'upstream' may mean that the light emitting group 20 is disposed closer to a current output terminal of the power supply unit 10, and 'downstream' may mean that the light emitting group 20 is disposed farther from the current output terminal of the power supply unit 10.

The light emitting device 100 may further include a first bypass unit 30 intermittently and electrically connecting an upstream stage of first light emitting groups 20 and 21, which are at an arbitrary location, and an upstream stage of second light emitting groups 20 and 22, which are at an arbitrary location behind the first lighting groups 20 and 21 towards downstream. Here, the 'upstream stage' may mean a terminal (i.e., a current inflow terminal) closer to the power supply unit 10 among terminals provided to the light emitting groups, and the 'downstream stage' may mean a terminal (i.e., a current outflow terminal) farther from the power supply unit 10 among terminals provided to the light emitting groups. Here, the 'intermittently connecting' means that a current flow channel may be formed or cut off between both terminals provided by the first bypass unit 30.

In addition, the light emitting device 100 may include a second bypass unit 40 intermittently and electrically connecting downstream terminals of the first light emitting groups 20 and 21 and downstream terminals of the second light emitting groups 20 and 22 or downstream terminals of third light emitting groups 20 and 23, which are at an arbitrary location behind the second lighting groups 20 and 23 towards downstream. Here, the 'intermittently connecting' means that a current flow channel may be formed or cut off between both terminals provided by the second bypass unit 40.

Figure 6B:
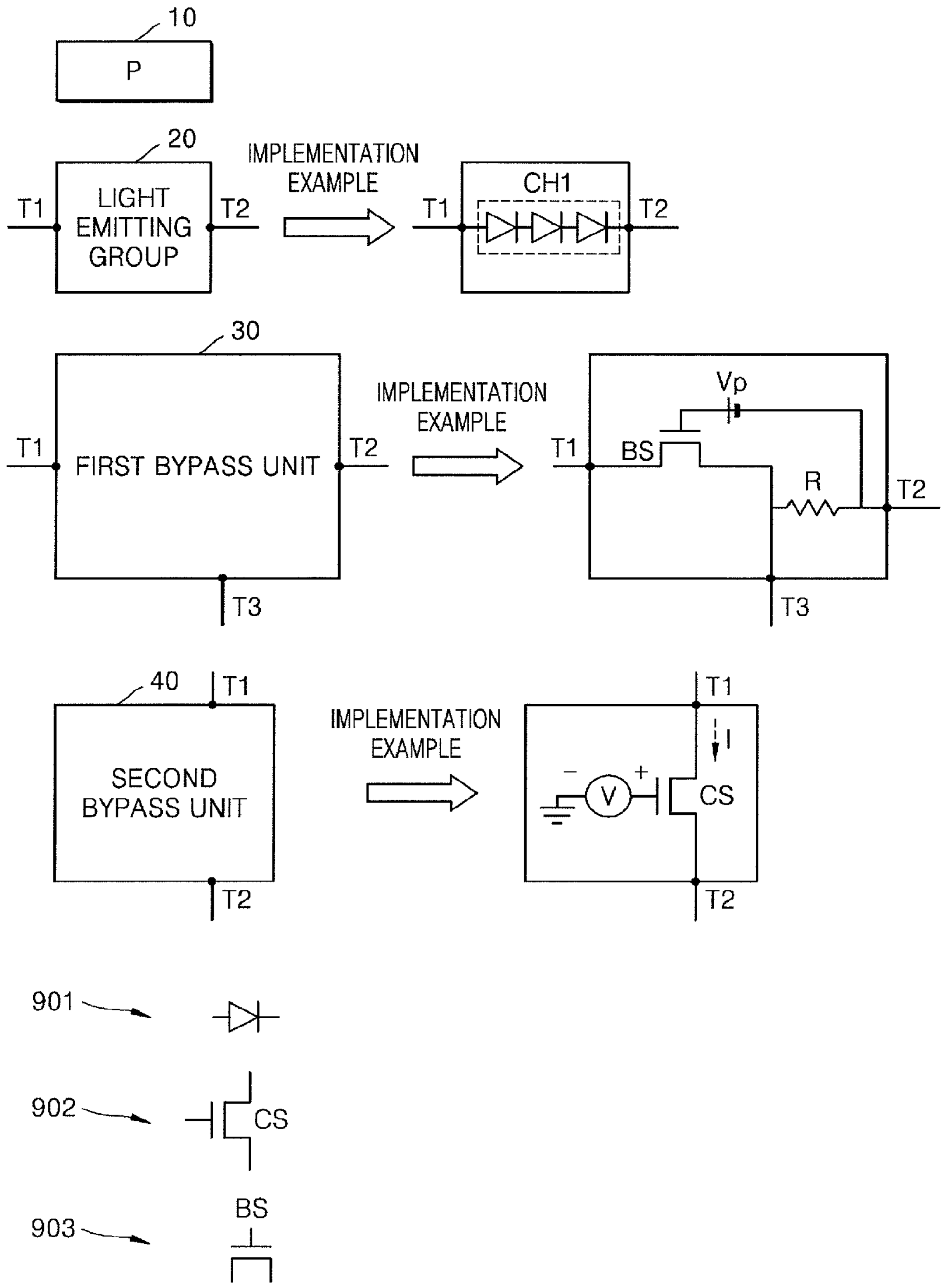
FIG. 6B illustrates the power supply unit, the light emitting group, the first bypass unit, the second bypass unit, and the light emitting device illustrated in FIG. 6A.

FIG. 6B illustrates the power supply unit 10, the light emitting group 20, the first bypass unit 30, the second bypass unit 40, and the light emitting device 901 illustrated in FIG. 6A. Among them, examples of detailed implementation of the light emitting group 20, the first and second bypass units 30 and 40 are illustrated together. These implementation examples are applied to the LED lighting circuit of FIG. 2. At this point, the circuit between both terminals T1 and T2, which is provided by the first bypass unit 30, is intermittently connectable by the bypass switches (BS) 903. A third terminal T3 may be selectively provided to the first bypass unit 30 according to an embodiment. In addition, a circuit between both the terminals T1 and T2, which is provided by the second bypass unit 40, may be intermittently connectable by the electric power distribution switch (CS) 902.

Hereinafter, the power supply unit 10 may also be referred to as 'a rectifying unit' in various embodiments to be described herein.

Furthermore, the light emitting group 20 may also be referred to as 'a light emitting channel' or 'an LED light emitting group'.

The first bypass unit 30 may be referred to as 'a jump circuit unit', 'a bypass line', or 'a first circuit unit'.

The second bypass unit 40 may also be referred to as 'an electric power distribution circuit unit', 'a second circuit unit'.

The light emitting device 901 may also be referred to as 'an LED cell', or 'an LED device'.

In addition, the bypass switch 903 may be referred to as 'a jump switch'.

Figure 7:
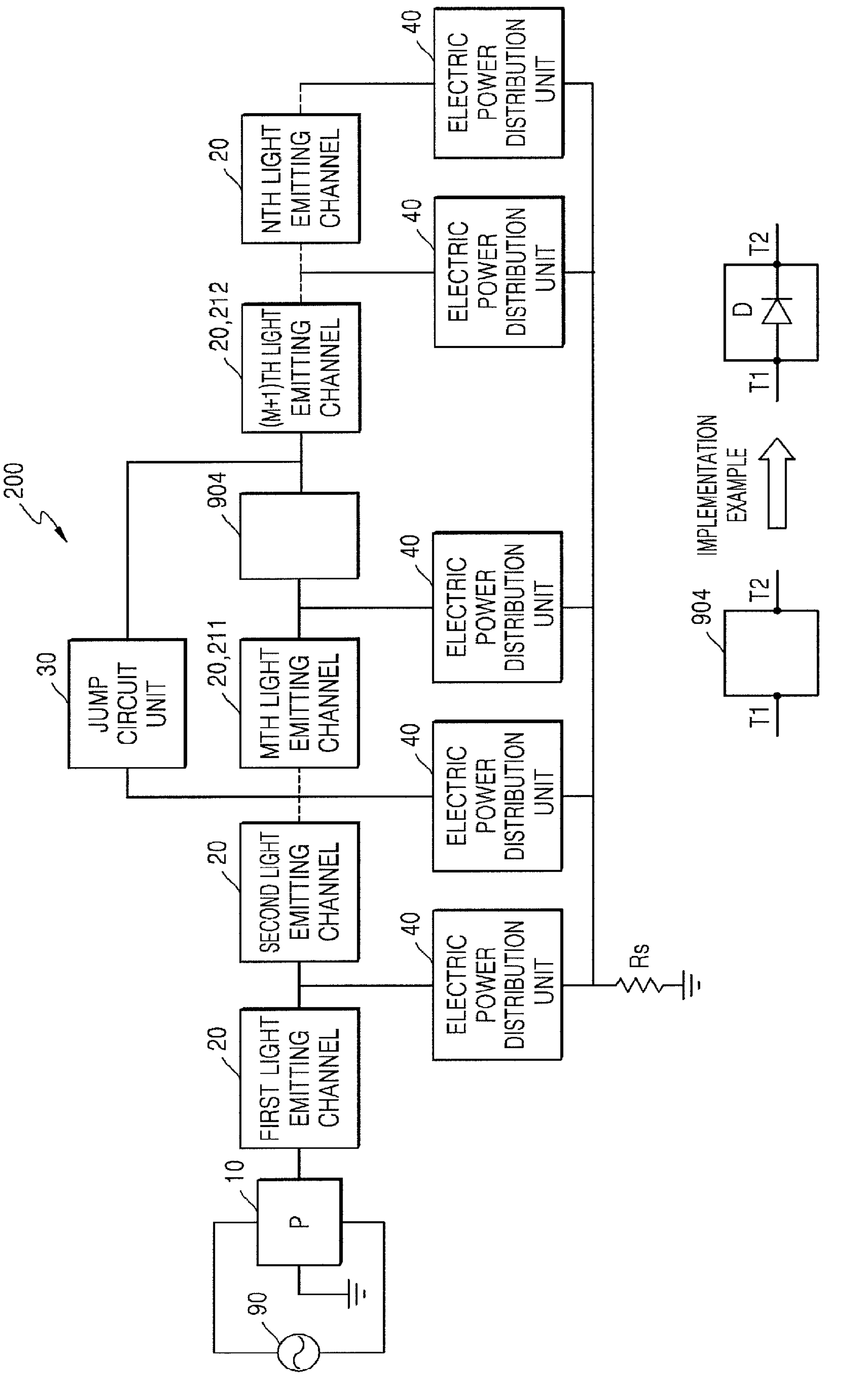
FIG. 7 is a view for explaining a structure of an LED lighting device according to another embodiment of the present invention.

FIG. 7 is a view for explaining a structure of the LED lighting device 200 according to another embodiment of the present invention.

The LED lighting device 200 may receive operation power from an AC power supply 90.

The LED lighting device 200 may include at least one LED cell 901 and also include linearly connected N (wherein N is a natural number not smaller than 2) light emitting channels 20.

Furthermore, the LED lighting device 200 may include the rectifier 10 electrically connected to a start stage of the light emitting channels 20 and rectifying AC power from the AC power supply 90 to allow the power to be provided to a last stage of the light emitting channels. Here, the start stage may mean the light emitting channels disposed closest to a current output terminal of the rectifying unit 10 among the rectifying channels 20, and the last stage may mean the light emitting channel disposed farthest from the current output terminal of the rectifying unit 10.

In addition, the LED lighting device 200 is bifurcated at each connecting unit between the light emitting channels 20 and is connected to the ground, and may include a plurality of electric power distribution circuit units 40 including an electric power distribution switch 902 intermittently connecting a current flowing through a connection path to the ground.

The LED lighting device 200 is bifurcated at an input stage of the Mth light emitting channels 20 and 211 among the light emitting channels 20 and is connected to an input stage of the (M+1)th light emitting channels 20 and 212 (where, M is a natural number not smaller than 1 and not greater than (N−1)), and may include a jump circuit unit 30 including a jump switch 903 intermittently connecting a current flowing through a connection path to the input stages.

Furthermore, the LED lighting device 200 is disposed on a circuit line between a connection unit disposed between the Mth light emitting channels 20 and 211 and the (M+1)th light emitting channels 20 and 212, and an input stage of the (M+1)th light emitting channels 20 and 212, and may further include a reverse current blocking unit 904 blocking a current flowing towards the input stage of the (M+1)th light emitting channels 20 and 212 from flowing towards the rectifying unit 10.

FIG. 7 illustrates an exemplary implementation view of the reverse current blocking unit 904. The reverse current blocking unit 904 may be implemented with a diode D or a transistor. An example of the transistor is the same as described above. Such an implementation example is applied to the LED lighting circuit 1 illustrated in FIG. 2. The reverse current blocking unit 904 may be implemented with not a diode D but a transistor, and, in this case, an ON/OFF state of the transistor may be controlled according to each time period P0 to P5 in FIG. 3.

The jump circuit unit 30, the light emitting channel 20, and the electric power distribution unit 40 illustrated in FIG. 7 may be implemented with an identical structure including the first bypass unit, the light emitting group, and the second bypass unit illustrated in FIG. 6A.

Figure 8:
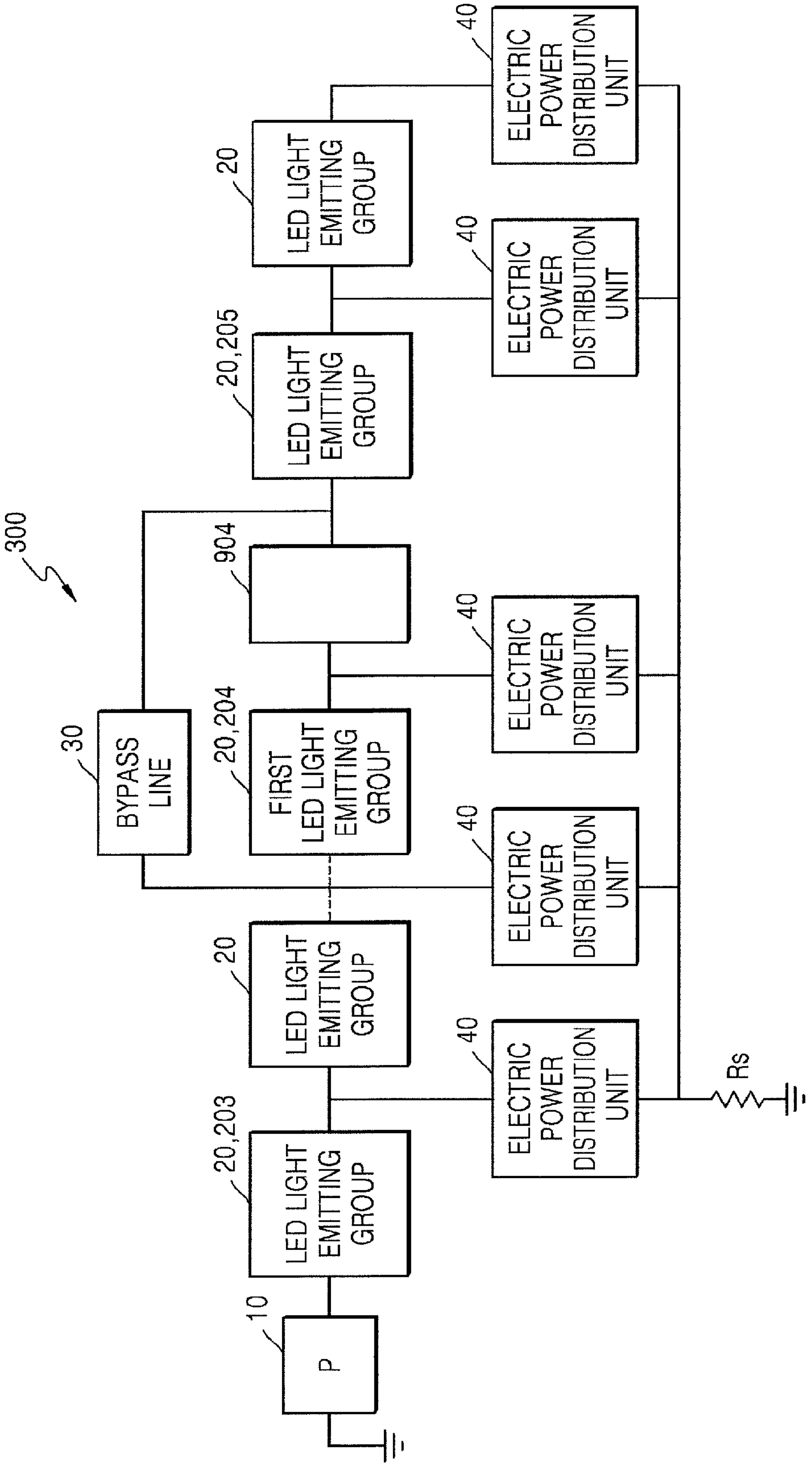
FIG. 8 is a view for explaining a structure of an LED driving device according to another embodiment of the present invention.

FIG. 8 illustrates a view for explaining a structure of the LED driving device 300 according to another embodiment of the present invention.

The LED driving device 300 may have a structure that a plurality of LED light emitting groups 20 each having at least one LED device 901 are sequentially connected.

The LED driving device 300 may include the power supply unit 10 applying AC power to the LED light emitting groups 20 and 203 at one end side of the LED light emitting group 20.

In addition, the LED driving device 300 may include a bypass line 30 connecting an input stage and an output stage of first LED light emitting groups 20 and 204, which are at least any ones among the LED light emitting group 20.

The LED driving device 300 may include a bypass switch 903 disposed on the bypass line 30 and closing the bypass line 30 when a potential of power supplied by the power supply unit 10 is not greater than a potential able to turn on next LED light emitting groups 20 and 205 following the first LED light emitting group 20 and 204.

The bypass line 30, the LED light emitting group 20 and the electric power distribution unit 40 may be implemented with the same structure as that of the first bypass unit, the light emitting group, and the second bypass unit illustrated in FIG. 6A. At this point, the above-described reverse current blocking unit 904 is disposed between a current output terminal of the bypass line 30 and current output terminals of the first LED light emitting group 20 and 204, so that a current output from the current output terminal of the bypass line 30 does not flow towards the first LED light emitting group 20 and 204.

Figure 9:
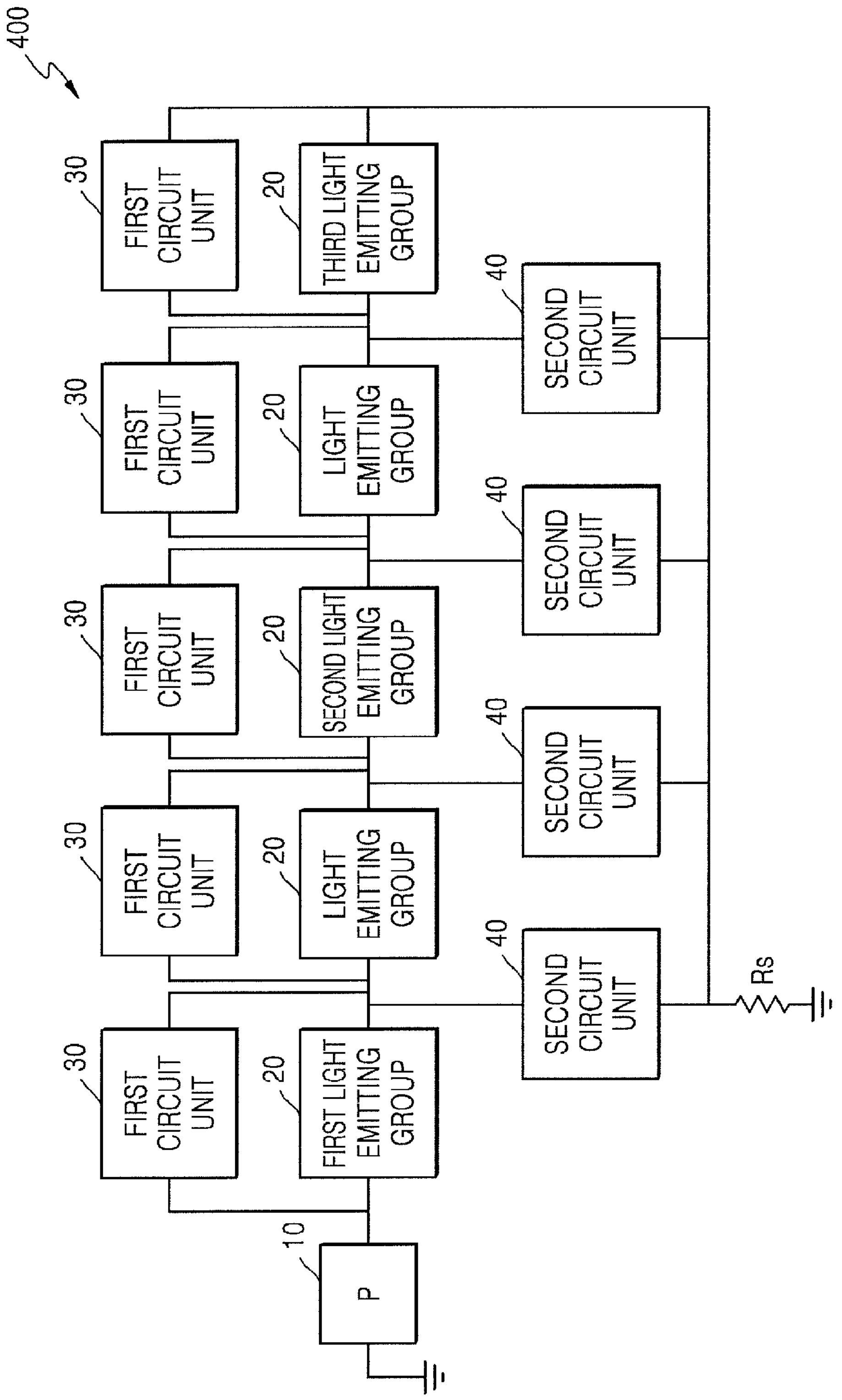
FIG. 9 is a view for explaining a structure of an LED lighting device according to another embodiment.

FIG. 9 is a view for explaining a structure of an LED lighting device 400 according to another embodiment of the present invention.

The LED lighting device 400 may receive driving power from the AC power supply 10.

The LED lighting device 400 may include the plurality of light emitting groups. At this point, each of the plurality of light emitting group 20 may include at least one LED device 901 and be linearly and electrically connected to have sequential numbers from uppermost stream to downmost stream. Here, the 'uppermost stream' represents the closest location to the current output terminal of the power supply unit 10 and the 'downmost stream' represents the farthest location.

In addition, the LED lighting device 400 may include a first circuit unit 30 bypassing connection points between the light emitting groups 20.

The LED lighting device 400 may include a second circuit unit 40 connecting the connection points and the ground so that the AC power is relatively first applied to the downstream side light emitting group rather than the upstream side light emitting group among the light emitting groups 20, while the supplied potential of the AC power supply 10 increases.

Here, a reverse current blocking unit may be disposed between current output terminals of the light emitting groups 20 and a current output terminal of the first circuit unit 30 bypassing the current that may flow through the arbitrary light emitting group 20. At this point, a current output from the current output terminal of the first circuit unit 30 does not flow through the reverse current blocking unit.

Figure 10:
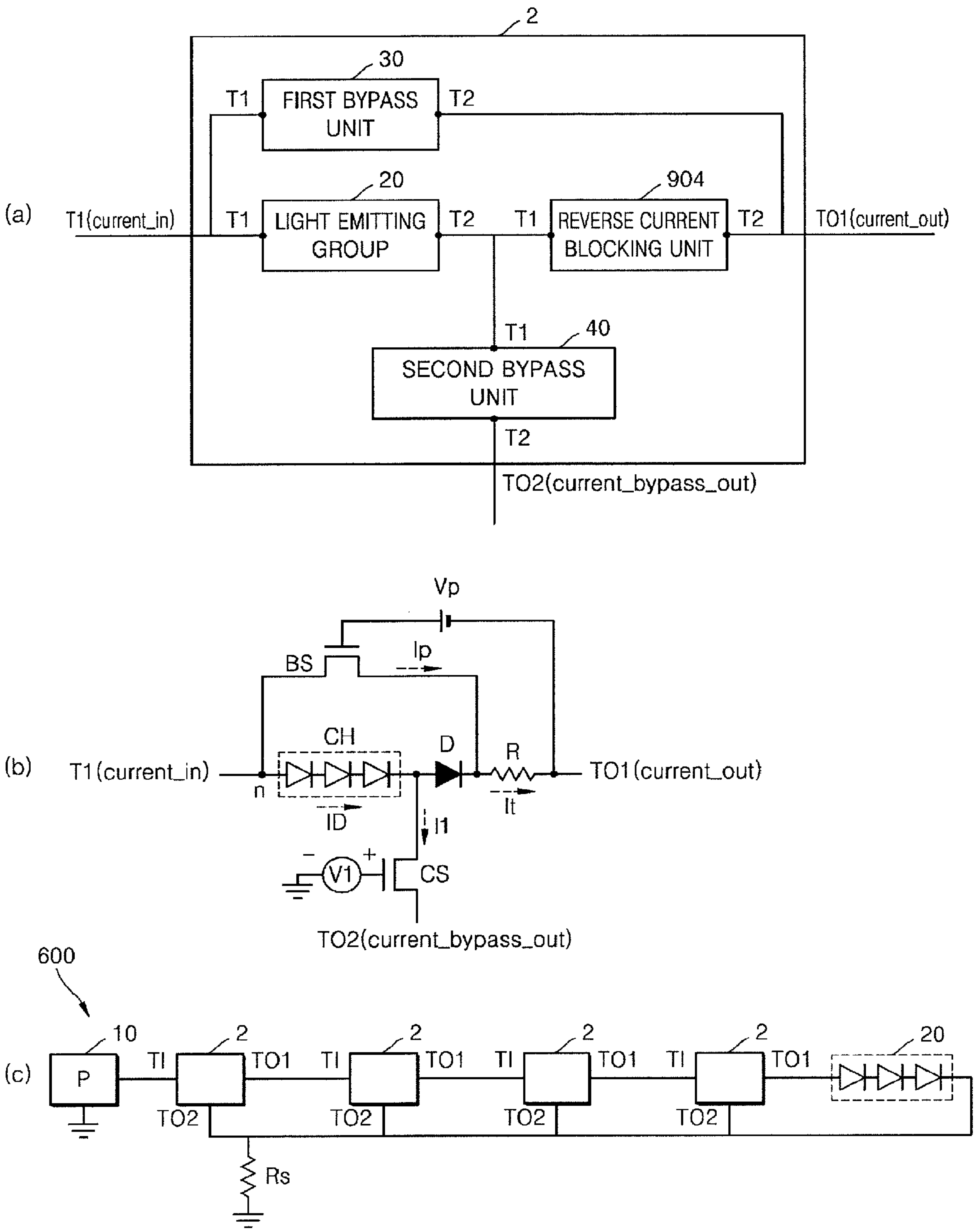
FIG. 10 is a view for explaining an embodiment of a light emitting unit configuring an LED driving circuit according to an embodiment of the present invention.

FIG. 10 is a view for explaining an embodiment of a light emitting unit configuring an LED driving circuit according to an embodiment of the present invention.

(a) of FIG. 10 is a block diagram of a light emitting unit 2 according to an embodiment of the present invention. The light emitting unit 2 may include three input/output terminals of a current input terminal TI, a current output terminal TO1, and a current bypass output terminal TO2.

The light emitting unit 2 may include a first bypass unit 30, a light emitting group 20, and a second bypass unit 40. The light emitting unit 2 may selectively include the reverse current blocking unit 904.

When both terminals of the first bypass unit 30 are connected (i.e., a current flows through the first bypass unit), both terminals of the second bypass unit 40 are connected (i.e., a current flows through the second bypass unit 40). When both the terminals of the first bypass unit 30 are in an open state (i.e., a current does not flow through the first bypass unit), both the terminals of the second bypass unit 40 may become an open state (i.e., a current does not flow through the second bypass unit).

Accordingly, when both the terminals of the first bypass unit 30 are connected, a part of a current input through the current input terminal TI is input to the light emitting group 20, another part of the current may be bypassed to a path provided by the first bypass unit 30. In addition, At least a part of or the entirety of a current output from the output terminal of the light emitting group 20 is not output to the current output terminal TO1, but bypassed through the second bypass unit 40 and output to the current bypass output terminal TO2. Moreover, the current passing through the path provided by the first bypass unit 30 may be output to the current output terminal TO1.

On the contrary, when both the terminals of the first bypass unit 30 are in the open state, a current input through the current input terminal TI is entirely input to the light emitting group 20. And the entirety of the current output from the output terminal of the light emitting group 20 may be output to the current output terminal TO1.

A resistor may be connected to the current bypass output terminal TO2. The resistor may be, for example, the resistor RS in FIG. 2. A value of a current flowing through the electric power distribution switch CS may determined by a value of the resistor and a value of a voltage V input to the electric power distribution switch CS in (b) of FIG. 10.

(b) of FIG. 10 illustrates an implementation example of the light emitting unit 2 illustrated in (a) of FIG. 10. The exemplary implementation of the light emitting unit 2 illustrated in (b) of FIG. 10 is applied to the LED lighting circuit 1 of FIG. 2.

(c) of FIG. 10 illustrate an LED lighting circuit 600 configured by connecting the light emitting units 2 illustrated in (a) of FIG. 10 according to an embodiment of the present invention.

The LED lighting circuit 600 may include the light emitting group 20, the current input terminal TI, the current output terminal TO1, and one or more light emitting units 2 including the current bypass output terminal TO2.

Here, the current output terminal TO1 may selectively output a part of or the entirety of a current input through the current input terminal TI. When the part of the current is output from the current output terminal TO1, rest of the entirety of the current other than the part of the current is output from the current bypass output terminal TO2. And, at this point, the rest of the current may be a current flowing through the light emitting group.

The current output terminal TO1 of the light emitting unit 2 may be connected to the other light emitting group 20. At this point, the other light emitting group 20 may be included in another light emitting unit or may not.

Furthermore, the current bypass output terminal TO2 of the light emitting unit 2 may be connected to a current output terminal of the other light emitting group 20. At this point, the other light emitting group 20 may be included in another light emitting unit or may not.

On the other hand, an AC driving LED lighting device may apply a triac dimmer and adjust brightness at the time of AC driving. However, when the triac dimmer is used, a voltage applied to the LED in a low brightness state becomes lowered, a jitter phenomenon of a dimmer output waveform is transferred to the LED without any change and then a phenomenon that LED brightness trembles may occur.

Figure 13:
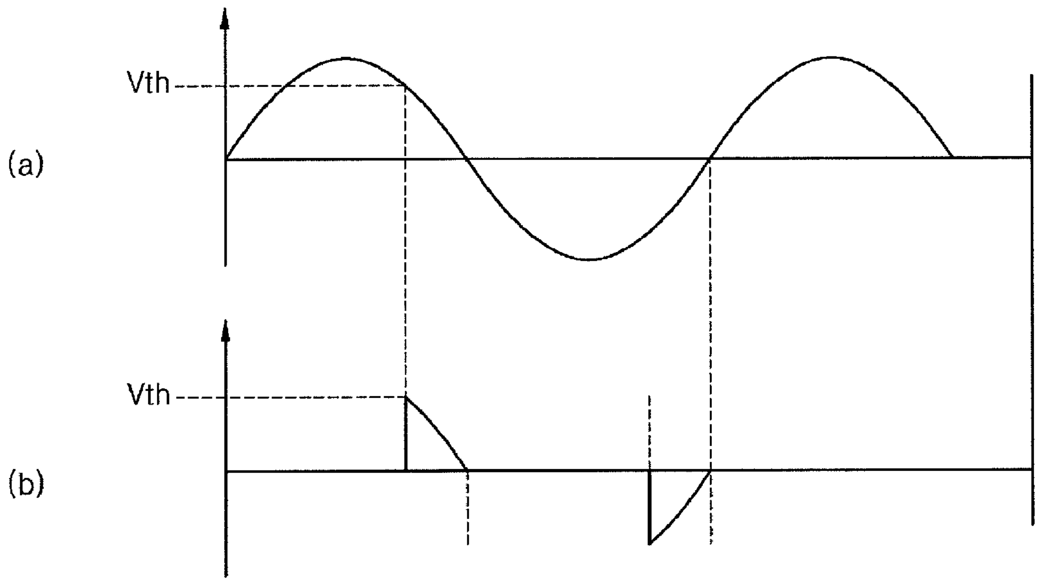
FIG. 13 illustrates an AC input waveform and an output waveform of a triac dimmer.

Referring to FIG. 13, for the triac dimmer output waveform of FIG. 13(*b*), a light trembling phenomenon may occur due to presence of a phase jitter in a low dimming level. FIG. 13(*a*) represents an AC input waveform.

Hereinafter, a dimming controlled LED driving circuit is described which is added to the LED lighting circuit according to the above described embodiments for light trembling prevention, when a triac dimmer is applied to the LED lighting circuit according to the above described embodiments. Such a dimming controlled LED driving circuit may be connected to control a bias voltage in the circuits or in the devices shown in FIGS. 1 to 10, and may turn off the LED at a predetermined voltage or smaller and prevent light trembling.

Figure 11:
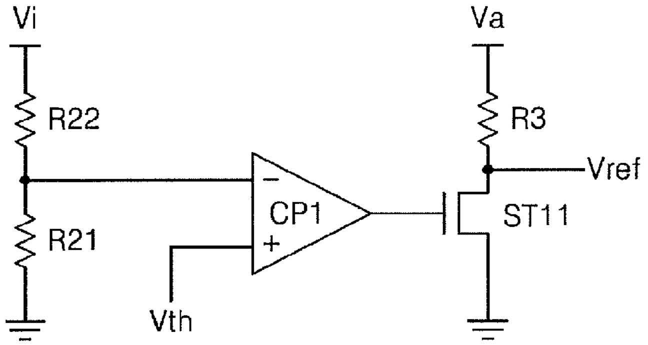
FIG. 11 is a view for explaining an exemplary LED driving circuit for preventing light trembling when a triac dimmer is applied to an LED lighting circuit according to an embodiment of the present invention.

FIG. 11 illustrates an exemplary dimming controlled LED driving circuit for light trembling prevention when a triac dimmer is applied to the LED lighting circuit according to embodiments of the present invention. Hereinafter, description is provided with reference to, for example, FIGS. 1 and 11.

Referring to FIGS. 1 and 11, a dimming controlled LED driving circuit may be combined to the LED lighting circuit of FIG. 1A in order to control a reference voltage to be divided into bias voltages V1 and V2. For example, the reference voltage Vref may be divided into the bias voltages V1 and V2 using a plurality of resistors.

A negative terminal of a comparator CP1 is connected to an intermediate node of which one end is grounded, the other end is connected to an input voltage Vi, and a voltage is divided by resistors R1 and R2. A positive terminal of the comparator CP1 may be connected to a threshold voltage Vth. An output terminal of the comparator CP1 is connected to a gate of a transistor ST11, one end of the transistor ST11 is connected to a voltage Va through a resistor R23, and another end of the transistor ST11 is grounded. The reference voltage Vref is output from a node between the one end of the transistor ST11 and the resistor R23.

According to this, when the input voltage Vi is smaller than a comparison voltage, namely, Vth*(1+R2/R1), an output of the comparator CP1 becomes a high state and the reference voltage Vref becomes 0V. In this case, since the bias voltages V1 and V2 all become 0V, the LED in FIG. 1A, namely, the light emitting group CH1 and CH2 are all turned off. On the contrary, when the input voltage Vi is greater than the comparison voltage, an output of the comparator CP1 becomes low and Vref becomes Va. In this case, at least a part of the light emitting group CH1 and CH1 may be turned on.

When this dimming controlled LED driving circuit is used and the input voltage Vi is not greater than the comparison voltage, the light emitting group CH1 and CH2 may be all maintained as an off state. Therefore, the LED becomes turned on and the light trembling phenomenon may be prevented.

Figure 12:
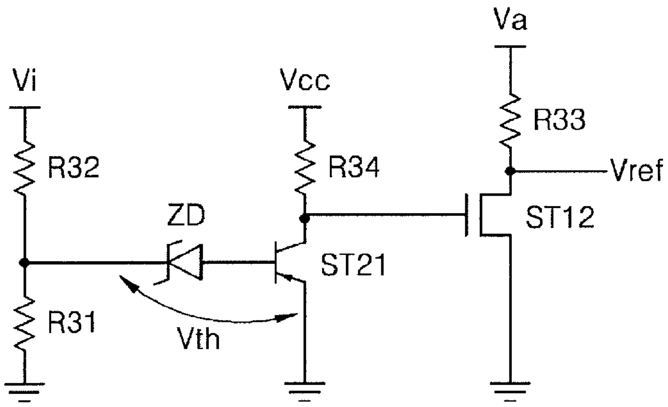
FIG. 12 is a view for explaining another example of an LED driving circuit for preventing light trembling when a triac dimmer is applied to an LED lighting circuit according to an embodiment of the present invention.

FIG. 12 illustrates another exemplary dimming controlled LED driving circuit for light trembling prevention when a triac dimmer is applied to the LED lighting circuit according to embodiments of the present invention. The driving circuit according to the embodiment is a circuit that a Zener diode ZD is used instead of the comparator CP1 and a part of the structure is modified in the driving circuit of FIG. 11.

Referring FIGS. 1 and 12, when the input voltage Vi is smaller than a comparison voltage, namely, Vth*(1+R32/R31), a transistor ST21 becomes turned off, a voltage Vcc is applied through a resistor R34 to a gate of a transistor ST12. Then, the transistor ST12 becomes turned on and a reference voltage Vref becomes 0V. In this case, since all the bias voltages V1 and V2 become 0V, the LED in FIG. 1A, namely, the light emitting group CH1 and CH2 become turned off. On the contrary, when the input voltage is greater than the comparison voltage, the transistor becomes turned on and 0V is applied to the gate of the transistor ST12. Then the transistor ST12 becomes turned off, and the reference voltage Vref becomes Va through a resistor R33. In this case, at least a part of the light emitting group CH1 and CH2 becomes turned on.

When this dimming controlled LED driving circuit is used and the input voltage Vi is not greater than the comparison voltage, the light emitting group CH1 and CH2 may be all maintained as an off state. Therefore, the LED becomes turned on and the light trembling phenomenon may be prevented.

The above-described dimming controlled LED driving circuit may be applied to the lighting circuit and lighting device in FIGS. 1A to 10C, and may be further used in various lighting circuits controlling LED lighting by using a bias voltage.

While the invention has been shown and described with reference to certain preferred embodiments thereof, it will be understood by those skilled in the art that various changes in form and details may be made therein without departing from the spirit and scope of the invention as defined by the appended claims. Therefore, the scope of the invention is defined not by the detailed description of the invention but by the appended claims, and all differences within the scope will be construed as being included in the present invention.

What is claimed is:

1. A dimming controlled LED lighting device comprising:

a power supply unit configured to produce a plurality of different output voltage;

a plurality of LED groups comprising a first LED group and a second LED group electrically connected to each other to have sequential numbers from upstream to downstream and receiving the power supply unit;

a rectifying unit configured to rectified AC power to the plurality of LED groups;

a LED lighting circuit including the plurality of LED groups, a current input terminal, a current output terminal, the current output terminal selectively output a part of or an entirety of a current input through the current input terminal; and a dimming controlled LED driving circuit connected to the LED lighting circuit to control a reference voltage to be divided a bias voltage using at least of resistors, wherein the dimming controlled LED driving circuit further comprises: a negative terminal of a comparator connected to an intermediate node of which one end is grounded, the other end is connected to an input voltage, and a positive terminal of the comparator connected to a threshold voltage, and wherein when the input voltage is smaller than a comparison voltage, an output of the comparator becomes a high state and the reference voltage becomes zero voltage.

2. The dimming controlled LED lighting device of claim 1, wherein the comparator further comprises: an output terminal of the comparator connected to a gate of a transistor, and one end of the transistor connected to a voltage through a resistor, another end of the transistor grounded.

3. The dimming controlled LED lighting device of claim 1, wherein when the input voltage is not greater than a comparison voltage, the first LED group and the second LED group maintained as an OFF state.

4. The dimming controlled LED lighting device of claim 1, wherein the plurality of LED groups further comprising: a current input terminal, a current output terminal, and the first LED group that emits light by a current inputted to the current input terminal.

5. The dimming controlled LED lighting device of claim 4, wherein the current output terminal selectively outputs an entirely of or at least part of a current inputted through the current input terminal.

6. A dimming controlled LED lighting device comprising:

a power supply unit configured to produce a plurality of different output voltage;

a plurality of LED groups comprising a first LED group and a second LED group electrically connected to each other to have sequential numbers from upstream to downstream and receiving the power supply unit;

a rectifying unit configured to rectified AC power to the plurality of LED groups;

a LED lighting circuit including the plurality of LED groups, a current input terminal, a current output terminal, the current output terminal selectively output a part of or an entirety of a current input through the current input terminal; and a dimming controlled LED driving circuit connected to the LED lighting circuit to control a reference voltage to be divided a bias voltage supplying element providing a predetermined voltage different between the current output terminal and a gate of a transistor, wherein the dimming controlled LED driving circuit further comprises: a negative terminal of a comparator connected to an intermediate node of which one end is grounded, the other end is connected to an input voltage, and a positive terminal of the comparator connected to a threshold voltage, and wherein when the input voltage is smaller than a comparison voltage, an output of the comparator becomes a high state and the reference voltage becomes zero voltage.

7. The dimming controlled LED lighting device of claim 6, wherein the comparator further comprises: an output terminal of the comparator connected to a gate of a transistor, and one end of the transistor connected to a voltage through a resistor, another end of the transistor grounded.

8. The dimming controlled LED lighting device of claim 6, wherein when the input voltage is not greater than a comparison voltage, the first LED group and the second LED group maintained as an OFF state.

9. The dimming controlled LED lighting device of claim 6, wherein the plurality of LED groups further comprising: a current input terminal, a current output terminal, and the first LED group that emits light by a current inputted to the current input terminal.

10. The dimming controlled LED lighting device of claim 9, wherein the current output terminal selectively outputs an entirely of or at least part of a current inputted through the current input terminal.

11. A dimming controlled LED lighting device comprising:

a power supply unit configured to produce a plurality of different output voltage;

a plurality of LED groups comprising a first LED group and a second LED group electrically connected to each other, wherein the first LED group includes a first upstream part and a first downstream part, the second LED group includes a second upstream part and a second downstream part;

a rectifying unit configured to rectified alternating current (AC) power and provide the rectified AC power to the plurality of LED groups;

a switch part configured to couple the first upstream part of the first light emitting group to the second upstream part of the second light emitting group;

a LED lighting circuit including the plurality of LED groups, a current input terminal, a current output terminal, the current output terminal selectively output a part of or an entirety of a current input through the current input terminal; and a dimming controlled LED driving circuit connected to the LED lighting circuit to control a reference voltage to be divided a bias voltage supplying element providing a predetermined voltage different between the current output terminal, wherein the dimming controlled LED driving circuit further comprises: a negative terminal of a comparator connected to an intermediate node of which one end is grounded, the other end is connected to an input voltage, and a positive terminal of the comparator connected to a threshold voltage, and wherein when the input voltage is smaller than a comparison voltage, an output of the comparator becomes a high state and the reference voltage becomes zero voltage.

12. The dimming controlled LED lighting device of claim 11, wherein the switch part comprise a bifurcation at each of connection units at the first LED group and the second LED group.

13. The dimming controlled LED lighting device of claim 11, wherein the switch part is further configured to form a series connection of the first LED group and the second LED group, in a region in which a forward voltage is equal to or greater than a predetermined voltage.

14. The dimming controlled LED lighting device of claim 11, wherein the switch part is further configured to form a parallel connection of the first LED group and the second LED group, in a region in which a forward voltage is below a predetermined voltage.

15. The dimming controlled LED lighting device of claim 11, wherein the switch part is further configured to automatically switch a connection of the first LED group and the second LED group between series and parallel connections based on a peak value of a detected voltage of the power supply unit.

16. The dimming controlled LED lighting device of claim 11, further comprising a first driving part configured to drive the first light emitting group and a second driving part configured to drive the second light emitting group.

* * * * *